(12) United States Patent
Madge

(10) Patent No.: US 6,931,297 B1
(45) Date of Patent: Aug. 16, 2005

(54) FEATURE TARGETED INSPECTION

(75) Inventor: Robert Madge, Portland, OR (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 10/794,225

(22) Filed: Mar. 5, 2004

(51) Int. Cl.[7] .............................................. G06F 19/00
(52) U.S. Cl. ..................................... 700/110; 700/121
(58) Field of Search ............................... 700/108, 109, 700/110, 121

(56) References Cited

U.S. PATENT DOCUMENTS

| | | | |
|---|---|---|---|
| 6,687,561 B1 * | 2/2004 | Pasadyn et al. | ............. 700/110 |
| 6,745,086 B1 * | 6/2004 | Bode et al. | ................. 700/121 |
| 6,754,593 B1 * | 6/2004 | Grover et al. | ................ 702/35 |
| 2004/0088068 A1 * | 5/2004 | Kadosh | ...................... 700/108 |

* cited by examiner

*Primary Examiner*—Leo Picard
*Assistant Examiner*—Charles Kasenge
(74) *Attorney, Agent, or Firm*—Luedeka, Neely & Graham, PC

(57) ABSTRACT

A method of inspecting a subject integrated circuit. A set of historical integrated circuits is inspected to detect defects and produce historical data. Features of the historical integrated circuits that have an occurrence of defects that is greater than a given limit are designated as high risk features, based on the historical data. Locations of the high risk features are identified on the subject integrated circuit. The locations of the high risk features are input into an inspection tool, and the locations of the high risk features on the integrated circuit are inspected to at least one of detect defects and measure critical dimensions, and produce subject data.

17 Claims, 3 Drawing Sheets

FEATURE TARGETED INSPECTION

FIELD

This invention relates to the field of integrated circuit fabrication. More particularly, this invention relates to inspection of integrated circuits.

BACKGROUND

In general terms, integrated circuits are fabricated by forming a layer, modifying the formed layer in same manner, such as by etching it, and then forming additional layers on top of it. As the layers are formed, different structures of the integrated circuit are created. During the course of fabrication for the integrated circuit, millions of structures are so formed. If even one of the structures is not formed correctly, it is possible that the integrated circuit will not function properly. Thus, great care is exerted to ensure that all of the structures on the integrated circuit are properly formed.

One method of ensuring that the structures are properly formed is to inspect the integrated circuit. By inspection it is meant that the shape of the structure is observed, typically through some process that can detect shape, such as an optical inspection or an inspection with an electron microscope, such as a scanning electron microscope. Such inspections are generally referred to as visual inspections herein, even though they may not be, and typically never are, conducted with the naked eye.

Visual inspections may be performed at various points in time during the fabrication process. For example, a visual inspection can be performed at the end of the fabrication process. However, at that point, many of the various layers and the structures which are formed thereon can no longer be seen by an inspection method that doesn't destroy the integrated circuit. Thus, it is generally desirable to inspect the integrated circuit at several different points during the fabrication process.

Unfortunately, several factors tend to dramatically increase the number of inspections that could be performed. For example, one factor is the number of layers that are used in modern integrated circuits. If an inspection is performed after the formation of each layer, then a significant number of inspections is required. In addition, modern integrated circuits use structures that are fashioned to be smaller and smaller as fabrication techniques improve. Thus, there are an ever increasing number of structures that could be inspected on each level.

As the number of individual inspection sites increases, so too does the amount of time that an inspection requires. For example, it is not unusual for an electron microscope inspection of a substrate on which integrated circuits are formed to require ten hours or more. Such time requirements have placed a severe burden on the throughput of integrated circuit processing.

One trend in the integrated circuit fabrication industry is the general increase of systematic defects that are often design dependent or layout dependant. Examples of these types of systematic defects include co-incident metal corners, stacked vias, vias on large metal lines, and electrically conductive lines that require optical proximity correction. These systematic defects are becoming generally more common than the traditional random defect mechanisms, and tend to be much more susceptible to process excursions such as alignment or equipment control.

What is needed, therefore, is a system by which integrated circuits can be adequately inspected, but which does not require such a great length of time.

SUMMARY

The above and other needs are met by a method of inspecting a subject integrated circuit. A set of historical integrated circuits is inspected to detect defects and produce historical defect data. Features of the historical integrated circuits that have an occurrence of defects that is greater than a given limit are designated as high risk features, based on the historical defect data. Locations of the high risk features are identified on the subject integrated circuit. The locations of the high risk features are input into an inspection tool, and the locations of the high risk features on the integrated circuit are inspected to detect defects and produce subject defect data.

In this manner, the various embodiments of the present invention enable an inspection to be performed on an integrated circuit, where the inspections may be particularly directed to those portions or features of the integrated circuit that historically have a greater incidence of failure. Thus, the inspection time is not unduly protracted by inspecting those portions of the integrated circuit in which there is a lower probability of defect occurrence. By so doing, the inspection time for the integrated can be designated as desired, such as by spending more time inspecting high risk features and less time inspecting other features, or by not inspecting other features at all.

In various preferred embodiments, the step of analyzing the set of historical integrated circuits comprises analyzing existing inspection results from a selected group of previously inspected integrated circuits. Alternately, the step of analyzing the set of historical integrated circuits comprises selecting a group of integrated circuits and then inspecting the selected group of integrated circuits. Preferably, the integrated circuit is a monolithic semiconducting integrated circuit. The inspection of the integrated circuit is preferably either an in process inspection or a final inspection. Preferably, the step of designating features as high risk features comprises a statistic analysis of the historical defect data. The step of identifying the locations of the high risk features preferably comprises analyzing design data for the subject integrated circuit. The inspection tool is preferably either an optical inspection tool or an electron microscope. Preferably, the step of inspecting the locations of the high risk features includes inspecting an area of a given minimum size that includes the high risk feature. In alternate embodiments, only the locations of the high risk features are inspected on the subject integrated circuit, or both the locations of the high risk features and other selectable locations are inspected on the subject integrated circuit. In one embodiment the subject defect data is added to the historical defect data to determine the high risk features.

According to another aspect of the invention there is described an apparatus for directing an inspection of a subject integrated circuit. Means are provided for accessing historical defect data in regard to a set of historical integrated circuits. Means are used for analyzing the historical defect data. Means are provided for receiving criteria from which a given limit is constructed. A means designates features of the historical integrated circuits that have an occurrence of defects that is greater than the given limit as high risk features, based on the historical defect data. Means are used for identifying locations of the high risk features on the subject integrated circuit. Means are provided for inputting the locations of the high risk features into an inspection tool, and directing the inspection tool to inspect the locations of the high risk features.

According to yet another aspect of the invention, there is described a software program on a computer readable media for directing an inspection of a subject integrated circuit. The program accesses historical defect data in regard to a set of historical integrated circuits, analyzes the historical defect data, receives criteria from which a given limit is constructed, designates features of the historical integrated circuits that have an occurrence of defects that is greater than the given limit as high risk features, based on the historical defect data, identifies locations of the high risk features on the subject integrated circuit, inputs the locations of the high risk features into an inspection tool, and directs the inspection tool to inspect the locations of the high risk features.

BRIEF DESCRIPTION OF THE DRAWINGS

Further advantages of the invention are apparent by reference to the detailed description when considered in conjunction with the figures, which are not to scale so as to more clearly show the details, wherein like reference numbers indicate like elements throughout the several views, and wherein.

DETAILED DESCRIPTION

Figure 1:
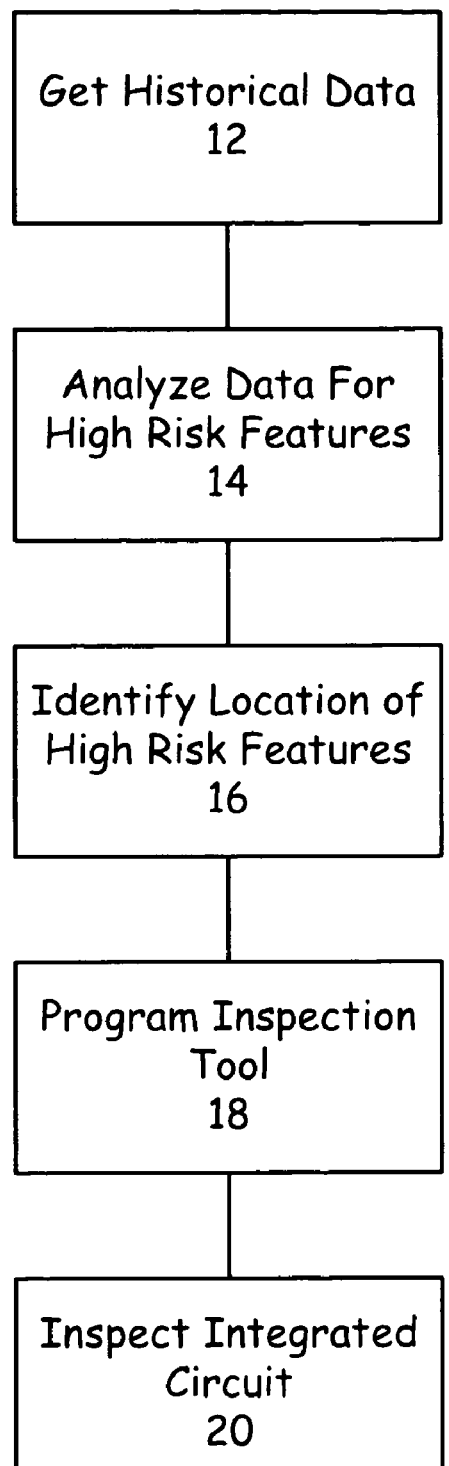
FIG. 1 is a flow chart of a method according to the present invention.

With reference now to FIG. 1, there is depicted a flow chart of a method 10 according to the present invention. As given in block 12, historical data is gathered. The historical data is preferably culled from a database of historical data that was gathered from integrated circuits that had previously been tested. Most preferably, the historical data is in regard to integrated circuits of the same type as that to be tested. However, in other embodiments, the historical data is taken from more than one type of integrated circuit, which include features of the same type or of a similar type.

For example, although it is preferred to use historical data from integrated circuits that are the same type of logic device, it is possible to alternately use historical data from other types of integrated circuits, such as memory, which include the same or similar features of interest. Examples of features include vias, trenches, gates, contacts, traces, and other physical design elements of an integrated circuit. Most preferably, the integrated circuits referred to herein are monolithic semiconducting devices, such as those formed on group IV materials such as silicon or germanium, or on group III–V materials such as gallium arsenide.

In another embodiment, instead of relying upon existing data to form the historical data, a desired group of integrated circuits is assembled and the integrated circuits are inspected to create the historical data. However, most preferably the historical data is taken from existing data that has been gathered from integrated circuits that were previously inspected.

The historical data can come from the inspection of previous products, failure analysis data, or results from test chips that have been specifically designed to identify these high risk defects. Alternately, these high risk features could be extracted from design rules. For example, design layout data can be analyzed to identify the statistical occurrence of these high risk situations, and the relevant locations can be fed into the inspection tool.

The historical data most preferably relates inspection data to test data. Inspection data generally relates to information in regard to how the integrated circuit appears visually. Such data includes, for example, information such as breaks in lines, poor edge definition, and other malformation of structures. Test data generally relates to information in regard to how the integrated circuit operates. Such data includes, for example, information such as open circuits, short circuits, and other far more complex electrical parameters. For each type of data, both inspection data and test data, there are certain incidents which are considered failures, or in other words, which are not desirable.

The historical data preferably includes sufficient information to relate the inspection data to the test data for a given integrated circuit, such that the visual appearance of certain types of tests results can be determined. Stated in another way, there is enough information to preferably correlate a certain type of visual flaw in the inspection data to a certain type of electrical flaw in the test data. This correlation cannot be done for all inspection data and test data, because some electrical flaws do not have a visually perceptible component, and some physical flaws do not yield an electrically perceptible component, at least not at the level of inspection or test that is conducted.

The historical data is analyzed as given in block 14 to determine high risk features. This is preferably accomplished such as with a two step process. First, a binning process is conducted, where similar structures are binned into feature groups. For example, all vias can be placed in one feature group, all gates can be placed in another feature group, all lines of a given width or on a given level of the integrated circuit can be placed in a third feature group, and so forth. The groups can be defined to be as narrow or as broad as desired. However, the defined breadth of the various groups will tend to have an impact on the efficiency gains of the methods according to the present invention, as described in more detail hereafter.

After all of the structures or the desired portion of the structures have been binned into feature groups, the historical data is also partitioned according to the feature groups. For example, in one embodiment the test data associated with a given structure within a feature group is culled from the historical data, and the number of failures is tallied for that feature group. This can then be repeated as desired for every failure of the various structures within the feature group, to yield a total failure count for that feature group. Preferably, this is accomplished for every failure for every structure within the feature group.

In another embodiment, the inspection data associated with a given structure within a feature group is culled from the historical data, and the number of failures is tallied for that feature group. This can then be repeated as desired for every failure of the various structures within the feature group, to yield a total failure count for that feature group. Preferably, this is accomplished for every failure for every structure within the feature group.

In yet another embodiment, both the test data and the inspection data associated with a given structure within a feature group are culled from the historical data, and those visual flaws which result in electrical flaws are identified and tallied for that feature. This can then be repeated as desired for every failure of the various structures with the feature group, to yield a total failure count for that feature group.

Preferably, this is accomplished for every failure for every structure within the feature group.

Once the failure tallies have been made for the various feature groups, high risk feature groups are identified, as given in block 16. This can be accomplished by any one or more of a variety of different methods. For example, in one embodiment, a given number of failures is determined to be a limit, and any feature group having more than the limit number of failures is identified as being a high risk feature group. Alternately, a feature group having any failures at all is identified as being a high risk feature group. In yet another embodiment, statistical means are used to determine those feature groups which have a statistically significant number of failures, and such feature groups are then identified as being high risk feature groups. Other methods could also be used.

Not only are the high risk feature groups identified, but the physical locations of the structures binned within the feature groups are also identified. Such information is preferably contained within the historical data, or may alternately be located in a separate database. For example, such information is typically available within an integrated circuit design database, which may or may not be considered to be a part of the historical data.

In a preferred embodiment, the physical location of each structure within a feature group that is identified as a high risk feature group is provided to an inspection tool, as given in block 18. For ease in referring to such information as provided to the inspection tool, the information will be called high risk location information in the further discussion below. The inspection tool is programmed to receive the high risk location information, and use it in some manner during the inspection of integrated circuits, as given in block 20. For example, in one embodiment, every location identified in the high risk location information is inspected by the inspection tool. In other embodiments, a relatively high percentage of the locations identified in the high risk location information is inspected by the inspection tool.

In some embodiments, other locations are also inspected by the inspection tool, even though they are not designated as high risk locations in the high risk location information. For ease in referring to locations on the integrated circuit that are not designated in the high risk location information, such locations are called low risk locations or low risk structures in the further discussion below. In these embodiments, either all of the low risk locations are inspected by the inspection tool, or none of the low risk locations are inspected by the inspection tool, or only some amount of the low risk locations are inspected by the inspection tool.

Several aspects of the method as described above have a bearing on the efficiency of the inspection process. For example, if a feature group is defined to include a relatively narrow range of structures within it, then if it is designated as a high risk group, there will be fewer structures slated for inspection, and the amount of time required for such an inspection will be generally reduced. As a specific example, if only the vias are included within the feature group, rather than vias and lines, then if the feature group is designated as a high risk group, only the vias would need to be inspected, and the lines may not need to be inspected.

Similarly, the level of failures at which a given feature group is designated as a high risk group also effects how efficient the inspection process will be. For example, if any failure at all designates a feature group as a high risk feature group, then there will tend to be a relatively greater number of high risk feature groups, which tends to indicate a relatively higher number of structures that will be inspected. However, having too high a value set as the limit for designating a feature group as a high risk feature group may allow too many structures to not be inspected.

Another selectable parameter which impacts the efficiency of the inspection process according to the present invention is the level at which high risk feature groups will be inspected. If all structures within the high risk feature groups are inspected, then a relatively greater amount of time will be required to perform the inspection. Finally, the level at which the low risk structures are inspected also impacts the efficiency of the process. If all low risk structures are inspected, then the inspection process will tend to require a relatively greater amount of time.

Most preferably, the selectable parameters as described above are balanced, such that a reasonable degree of inspection is accomplished, and the inspection is predominantly directed toward those structures which have a higher historical defect rate. This balance of the selectable parameters may be accomplished by either a statistical or an empirical process. For example, there are various statistical procedures which can be used to determine the levels of the various selectable parameters, and yield a balance that will achieve the desired inspection goals. Alternately, the levels of the various selectable parameters can be adjusted, such as one at a time and in various combinations, until it is observed that the inspection method yields the desired results. Most preferably, some type of statistical process is first used to set the level of the selectable parameters, and then the levels of the selectable parameters are fine tuned using a combination of both statistical and empirical information as the process runs.

As a specific example, the structures are binned so that only structures of a single type are placed within a single feature group. A feature group is designated as a high risk feature group if the number of failures within the feature group is statistically significant in comparison to the number of failures within the other feature groups. High risk feature groups are inspected at a one hundred percent level, or in other words, every structure binned within a high risk feature group is inspected. Low risk features are inspected at a sampled level that is statistically determined, based upon the expected failure rates for non high risk failure groups. In this manner, the integrated circuit is, in most cases, inspected at a reduced level, which enables the integrated circuit to be inspected more quickly. This allows integrated circuits to inspected on fewer inspection stations, or more integrated circuits to be inspected. Thus, inspection costs are generally decreased and inspection capacity is generally increased.

The method can also be adjusted by setting different inspection levels for different high risk feature groups. In other words, not every high risk feature group needs to be inspected at the same level. Similarly, different inspection levels can be set for structures that exist on different layers of the integrated circuit. In other words, structures on a first layer may be inspected at a first level, and structures on a second layer may be inspected at a second level that is different from the first level.

Figure 2:
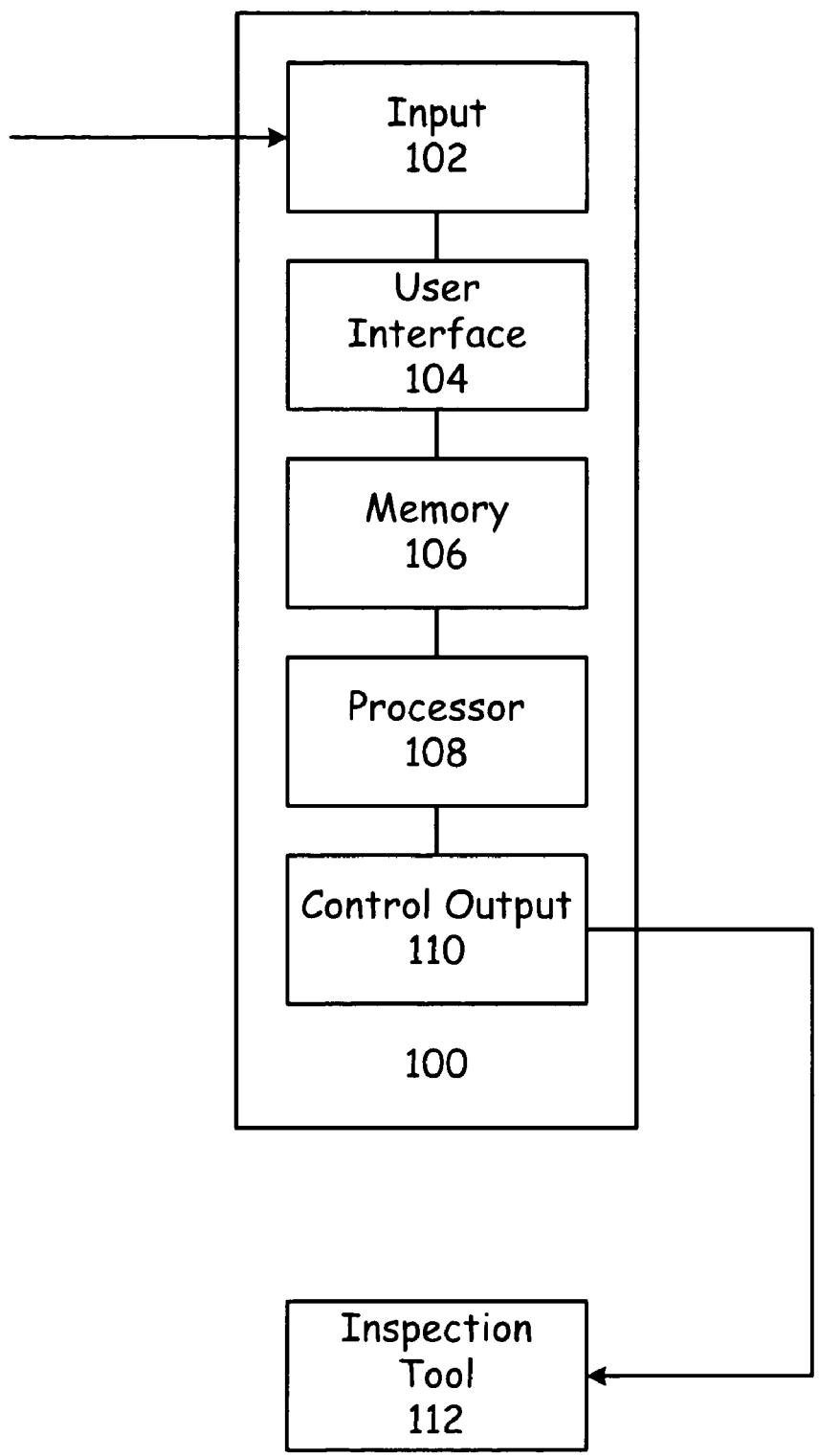
FIG. 2 is a functional block diagram of an apparatus according to the present invention.

A functional block diagram of an apparatus 100 according to the present invention is depicted in FIG. 2. The apparatus 100 preferably includes an input 102, such as a computer network input, through which the historical data can be accessed. In a most preferred embodiment, the historical data already exists, such as in an engineering database, and is disposed on a centralized computer database, which is accessible through a network interface, such as the input 102.

A user interface 104 is preferably used to program the apparatus 100, such as to input parameters used for the selection of the failure limits by which feature groups are designated as high risk feature groups, and the level of inspection for both high risk feature groups and low risk structures. The historical information or other information can preferably also be presented to an operator, such as on a display of the user interface 104. A memory 106 preferably holds historical data as needed, and the limits and other information used by the apparatus 100. The processor 108 is used to accomplish the computations and other logic and control functions of the apparatus 100.

A control output 110 preferably interfaces with the inspection tool 112 itself, and provides the information whereby the inspection tool 112 is directed to inspect the integrated circuit, as described above. In some embodiments, the apparatus 100 directly controls the operation of the inspection tool 112 moment by moment through the control output 110. In other embodiments the apparatus 100 only provides the inspection information to the inspection tool 112, which then directs its own operation using the inspection information received from the apparatus 100 through the control output 110. In other embodiments, the apparatus 100 is included as a module within the inspection tool 112, and is not a separate box. Alternately, the inspection information can be sent to or requested by the inspection tool 112 through a network interface, such as the input 102 in some embodiments.

In a most preferred embodiment, the inspection tool 112 is a scanning electron microscope, and the apparatus 100 is either a personal computer, or a logic module running within the controller of the scanning electron microscope. In one embodiment, the method is embodied within a program disposed on a computer readable media, which program is able to direct a personal computer to perform the method steps as described above. Thus, it is appreciated that there are many different embodiments and forms for the present invention.

Figure 3:
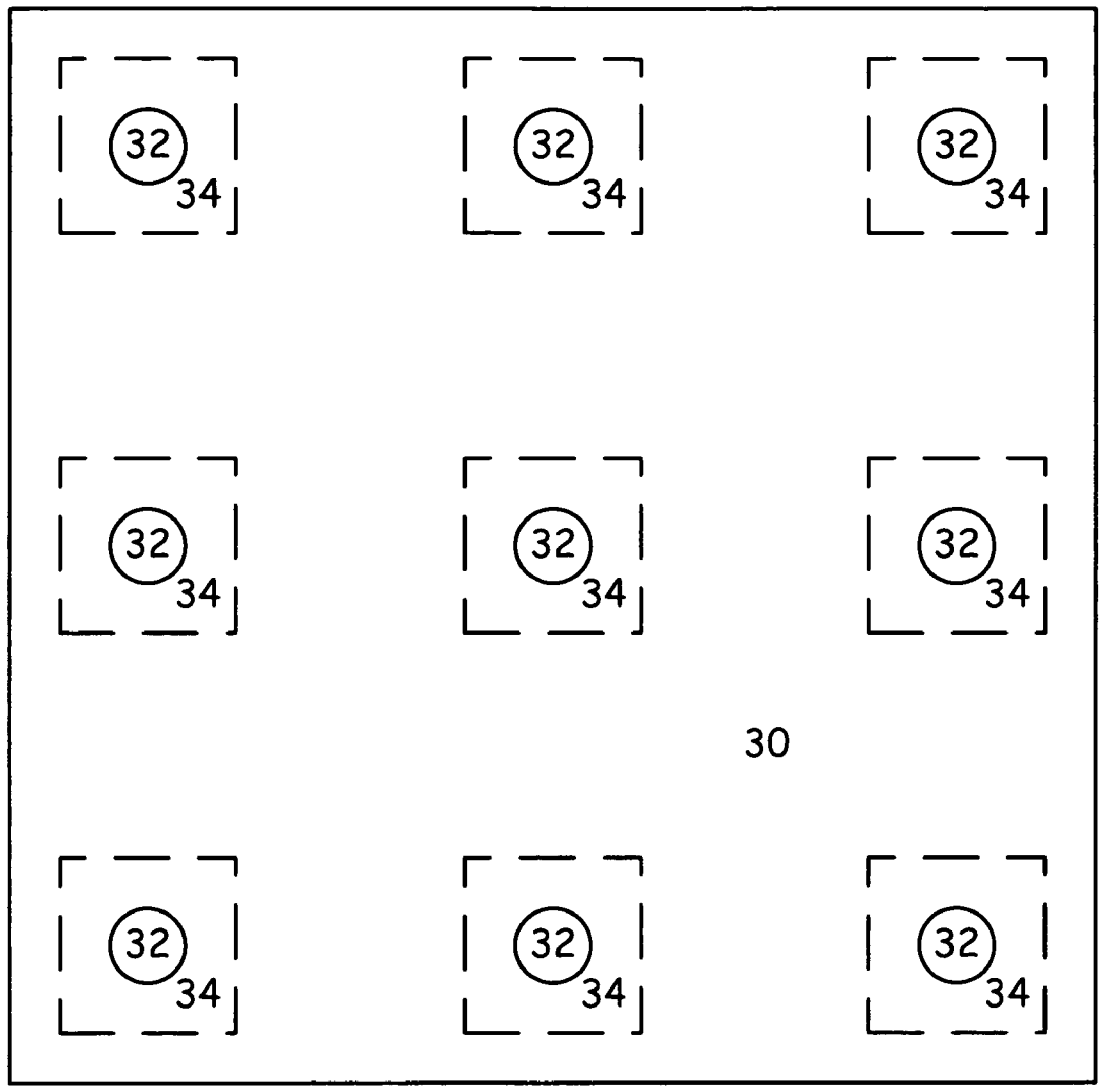
FIG. 3 is an integrated circuit depicting high risk features and minimum inspection areas according to the present invention.

As depicted in FIG. 3, in a most preferred embodiment, an area of interest 34 surrounds the structures 32 of a high risk feature group that are to be inspected. The area of interest 34 on the integrated 30 is also inspected. The size of the area of interest 34 is another of the selectable parameters that effects the efficiency of the method as described herein. As the area of interest is increased, the amount of area to be inspected is generally increased, and so too is the length of time required for the inspection process. However, if the area of interest is reduced, such as to a single point representing the center of the structure, for example, the possibility of missing a defect increases. Thus, similar to that as described above, a balance is preferably found, either statistically or empirically or by a blend of each, whereby a large enough area of interest 34 is inspected, while the inspection process itself is not unduly protracted.

Another embodiment of the method according to the present invention is to measure critical dimensions such as with a scanning electron microscope in the area of these features of interest. In this embodiment, the feature of interest may not be a high risk feature in terms of a heightened risk of defect, but it is desirable to measure the feature for parametric performance. Traditionally, critical dimensions are measured in one place in the scribe lines between the integrated circuits on the substrate. However, such a measurement often does not represent real parametric performance. If critical dimensions are measured in the specific features that are likely to be a worst case scenario, such as may be determined from test chip or historical product data, then the process can be fine tuned much more accurately.

Although there have been some distinctions made herein between inspection processes and test processes, and the description of the methods and apparatuses as described herein has generally been made in regard to inspection, it is understood that these methods are also generally applicable to testing and are not to be limited to inspection alone.

The foregoing description of preferred embodiments for this invention has been presented for purposes of illustration and description. It is not intended to be exhaustive or to limit the invention to the precise form disclosed. Obvious modifications or variations are possible in light of the above teachings. The embodiments are chosen and described in an effort to provide the best illustrations of the principles of the invention and its practical application, and to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally, and equitably entitled.

What is claimed is:

1. A method of inspecting a subject integrated circuit, the method comprising the sequential steps of:
    analyzing a set of historical integrated circuits to detect defects and produce historical data,
    designating features of the historical integrated circuits that have an occurrence of defects that is greater than a given limit as high risk features, based on the historical data,
    identifying locations of the high risk features on the subject integrated circuit,
    inputting the locations of the high risk features into an inspection tool, and
    inspecting the locations of the high risk features on the integrated circuit by inspecting an area of a given minimum size that includes the high risk feature to at least one of detect defects and measure critical dimensions, and produce subject data.

2. The method of claim 1, wherein the step of analyzing the set of historical integrated circuits comprises analyzing existing inspection results from a selected group of previously inspected integrated circuits.

3. The method of claim 1, wherein the step of analyzing the set of historical integrated circuits comprises selecting a group of integrated circuits and then inspecting the selected group of integrated circuits.

4. The method of claim 1, wherein the integrated circuit is a monolithic semiconducting integrated circuit.

5. The method of claim 1, wherein the inspection of the integrated circuit is an in process inspection.

6. The method of claim 1, wherein the inspection of the integrated circuit is a final inspection.

7. The method of claim 1, wherein the step of designating features as high risk features comprises a statistic analysis of the historical data.

8. The method of claim 1, wherein the step of identifying the locations of the high risk features comprises analyzing design data for the subject integrated circuit.

9. The method of claim 1, wherein the inspection tool is an optical inspection tool.

10. The method of claim 1, wherein the inspection tool is an electron microscope.

11. The method of claim 1, wherein only the locations of the high risk features are inspected on the subject integrated circuit.

12. The method of claim 1, wherein both the locations of the high risk features and other selectable locations are inspected on the subject integrated circuit.

13. The method of claim 1, wherein the subject data is added to the historical data to determine the high risk features.

14. An apparatus for directing an inspection of a subject integrated circuit, the apparatus comprising:
   means for accessing historical data in regard to a set of historical integrated circuits,
   means for analyzing the historical data,
   means for receiving criteria from which a given limit is constructed,
   means for designating features of the historical integrated circuits that have an occurrence of defects that is greater than the given limit as high risk features, based on the historical data,
   means for identifying locations of the high risk features on the subject integrated circuit, and
   means for inputting the locations of the high risk features into an inspection tool and directing the inspection tool to inspect the locations of the high risk features by inspecting an area of a given minimum size that includes the high risk feature.

15. The apparatus of claim 14, wherein the inspection tool is an electron microscope.

16. A software program on a computer readable media for directing an inspection of a subject integrated circuit, the program having modules adapted to:
   access historical data in regard to a set of historical integrated circuits,
   analyze the historical data,
   receive criteria from which a given limit is constructed,
   designate features of the historical integrated circuits that have an occurrence of defects that is greater than the given limit as high risk features, based on the historical data,
   identify locations of the high risk features on the subject integrated circuit, and
   input the locations of the high risk features into an inspection tool and directing the inspection tool to inspect the locations of the high risk features by inspecting an area of a given minimum size that includes the high risk feature.

17. The program of claim 16, wherein the inspection tool is an electron microscope.

* * * * *